(12) United States Patent
Pulicken et al.

(10) Patent No.: US 12,349,321 B2
(45) Date of Patent: Jul. 1, 2025

(54) OPTIMIZING CHILLER ENERGY EFFICIENCY IN A MULTIPLE DATA CENTER SET-UP

(71) Applicant: Kyndryl, Inc., New York, NY (US)

(72) Inventors: Antony Pulicken, Bangalore (IN); Paramita Chakraborty, Bangalore (IN); Gerhard Ingmar Meijer, Zurich (CH)

(73) Assignee: Kyndryl Inc., New York, NY (US)

( * ) Notice: Subject to any disclaimer, the term of this patent is extended or adjusted under 35 U.S.C. 154(b) by 494 days.

(21) Appl. No.: 17/738,402

(22) Filed: May 6, 2022

(65) Prior Publication Data

US 2023/0363118 A1  Nov. 9, 2023

(51) Int. Cl.
*H05K 7/20* (2006.01)

(52) U.S. Cl.
CPC ....... *H05K 7/20836* (2013.01); *H05K 7/2079* (2013.01)

(58) Field of Classification Search
CPC .. H05K 7/20836; H05K 7/2079; G06F 1/206; G06N 3/0442; G06N 3/045; G06N 3/0464; G06N 3/09; G06N 5/045; G06N 20/00; G06Q 50/06; G06Q 10/04
See application file for complete search history.

(56) References Cited

U.S. PATENT DOCUMENTS

| | | |
|---|---|---|
| 9,448,544 B2 | 9/2016 | Slessman et al. |
| 10,152,394 B2 | 12/2018 | Demetriou et al. |
| 2006/0085242 A1* | 4/2006 | Mark ..................... G06Q 40/00 705/28 |
| 2017/0089601 A1 | 3/2017 | Patil et al. |
| 2020/0049394 A1 | 2/2020 | Szewerenko et al. |
| 2020/0136195 A1 | 4/2020 | Tiwari et al. |
| 2020/0409814 A1 | 12/2020 | Tiwari |

(Continued)

FOREIGN PATENT DOCUMENTS

WO  2018004464  1/2018

OTHER PUBLICATIONS

Mell et al., "The NIST Definition of Cloud Computing", NIST, Special Publication 800-145, Sep. 2011, 7 pages.

(Continued)

*Primary Examiner* — Charles R Kasenge
(74) *Attorney, Agent, or Firm* — Erik Swanson; Andrew D. Wright; Calderon Safran & Wright P.C.

(57) ABSTRACT

A method includes: integrating, by the computing device, a combination of user identified parameters in a template-based framework with historical operations data of a plurality of data centers in a multiple data center set-up to produce a feature set of parameters; clustering, by the computing device, the exclusive feature set of parameters into an optimal number of groups, each of which comprise similar physical attributes of chillers associated with any of the plurality of data centers; generating, by the computing device, analytical models for data center infrastructure component energy efficiency optimization of the multiple data center set-up based on the optimal number of groups; and providing recommendations from the analytical models as to which parameters are to be adjusted to have a more efficient energy utilization of the data center infrastructure components.

20 Claims, 7 Drawing Sheets

(56) References Cited

U.S. PATENT DOCUMENTS

2021/0185847 A1 6/2021 Gao
2021/0287072 A1 9/2021 Evans et al.

OTHER PUBLICATIONS

Ma et al., "Monotonic Neural Network: Combining Deep Learning with Domain Knowledge for Chiller Plants Energy Optimization", ArXiv.org, Jun. 11, 2021, 13 pages.
Lu, et al., "The Optimization of Chiller Loading by Adaptive Neuro-Fuzzy Inference System and Genetic Algorithms", Hindawi, Jul. 1, 2015, 11 pages.

* cited by examiner

OPTIMIZING CHILLER ENERGY EFFICIENCY IN A MULTIPLE DATA CENTER SET-UP

BACKGROUND

Aspects of the present invention relate generally to machine learning systems and, more particularly, to machine learning systems to optimize chiller energy efficiency in a multiple data center set-up.

In a multiple data center set-up, a service provider may have numerous data centers with several chillers in each data center. The complexity and uniqueness of chillers require development of sophisticated analytical models to optimize their energy efficiency in a data center. In addition, multiple diverse chillers (that can be of different types, for example) across several data centers (that can be in different climate regions, for example) necessitate developing numerous individual models to enable overall energy efficiency optimization. This results in a significant effort in development, deployment, maintenance, and life-time-cycle management of the numerous individual models.

For example, traditional ways of developing energy efficiency optimization models is achieved by creating one model across all the data centers or creating one model each for each chiller in each data center. While the first method results in a significant compromise on the model performance, the latter method incurs a considerable increase in development, deployment, manpower and maintenance costs, rendering these types of models operationally infeasible. In the latter method, for each added chiller, a new model is necessary which also increases development, deployment, manpower and maintenance costs.

SUMMARY

In a first aspect of the invention, there is a method including: integrating, by the computing device, a combination of user identified parameters in a template-based framework with historical operations data of a plurality of data centers in a multiple data center set-up to produce a feature set of parameters; clustering, by the computing device, the feature set of parameters into an optimal number of groups, each of which comprise similar physical attributes of a data center infrastructure component associated with any of the plurality of data centers; generating, by the computing device, analytical models for data center infrastructure component energy efficiency optimization of the multiple data center set-up based on the optimal number of groups; and providing recommendations from the analytical models as to which parameters are to be adjusted to have a more efficient energy utilization of the data center infrastructure components.

In another aspect of the invention, there is a computer program product including one or more computer readable storage media having program instructions collectively stored on the one or more computer readable storage media. The program instructions are executable to: obtain data center infrastructure components historical operations data of data centers in a multiple data center set-up; compute a data center infrastructure component attribute score obtained of from a list of attributes in a template framework and which is associated with data centers in a multiple data center set-up; and create data center infrastructure component data buckets using a data center infrastructure component data generalization algorithm 615, wherein the data center infrastructure component data buckets are an optimal number of groupings of data center infrastructure components each of which include similar component attributes as defined in templates of the template framework.

In another aspect of the invention, there is system including a processor, a computer readable memory, one or more computer readable storage media, and program instructions collectively stored on the one or more computer readable storage media. The program instructions are executable to: integrate a combination of user identified parameters within a template-based framework with historical operations data of a plurality of data centers in a multiple data center set-up to produce a feature set of parameters; cluster the feature set of parameters into an optimal number of groups, each of which comprise similar physical attributes of components associated with any of the plurality of data centers; and generate analytical models for data center infrastructure component energy efficiency optimization of the multiple data center set-up based on the optimal number of groups.

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Aspects of the present invention relate generally to machine learning systems and, more particularly, to machine learning systems to optimize data center infrastructure component (i.e., a chiller, a water pump, a computer room air handler, and a cooling tower, etc.) energy efficiency in a multiple data center set-up. In embodiments, the method, system and/or computer program product may use historical data from data centers as well as additional feature variables incorporated as user-configured inputs and data center design parameters from a template-based framework to train machine learning models to optimize data center infrastructure component energy efficiency (i.e., a chiller, a water pump, a computer room air handler, and a cooling tower, etc.) within multiple data centers. For example, according to aspects of the invention, the method, system and/or computer program create data center infrastructure component energy efficiency models by producing an optimal number of "data buckets" in a multiple data center set-up and, which are used to create optimized models of the data center infrastructure components. As should be understood, each data bucket includes groups of data center infrastructure components (i.e., a chiller, a water pump, a computer room air handler, and a cooling tower, etc.) from a same or different location with one or more similar attribute (which may be weighted by the user). In this manner, it is possible to automatically identify a precise combination of parameters with its corresponding relevant weightage to generate analytical models for data center infrastructure component energy efficiency optimization, e.g., chiller energy efficiency optimization.

It should be understood by those of skill in the art that the method, system and/or computer program product herein are applicable to the energy efficiency any data center infrastructure components, i.e., a water pump, a computer room air handler, and a cooling tower, etc., and that the use of the chiller is but one non-limiting example of use. And although the present disclosure is discussed with reference to a chiller in a data center, one of skill in the art would readily recognize that the method, system and/or computer program product are equally applicable to providing energy efficiency models for any other components of the data center.

Accordingly, in more specific aspects of the invention, the method, system and/or computer program product generalize chiller energy efficiency models by producing an optimal number of data center infrastructure component energy data buckets (hereinafter referred to as "chiller data buckets") in a multiple data center set-up. In particular, aspects of the invention comprise dynamically generating feature variables by incorporating user configured inputs and data center design parameters from a template-based framework, and automatically identifying a precise combination of parameters with its corresponding relevant weightage. This data may be integrated with chiller historical operations data to produce a feature set fed into a machine learning based clustering algorithm to produce an optimal number of data buckets, which may be used to generate analytical models for chiller energy efficiency optimization. In embodiments, each of the different data buckets represent a cluster or group of chillers with similar parameters and/or attributes. New or additional chillers (or data centers) can be classified into one of these data buckets based on its similarity to the existing attributes of the data buckets, without the need to generate new models for each chiller.

Accordingly, the system, method and/or computer program product described herein provide a technical solution to a problem of optimizing chiller energy efficiency in multiple data center set-ups using machine learning techniques. For example, in implementations of the present invention, the system, method and/or computer program product integrate domain, user preferences (e.g., attributes of a chiller, its location, conditions, etc., as defined by the user and entered into configurable template) and underlying data distributions to generate chiller energy efficiency models for disparate data centers. The framework includes the configurable templates which include chiller metadata (e.g., type of speed drive, capacity, type of chiller, health score, and-so-forth) and data center design considerations (e.g., chiller sequencing, coupled/decoupled systems, chiller connectivity, cooling demand, geographical location, and-so-forth). And in these templates, the user can prioritize and/or weight the importance of any chiller attributes, certain preferences and/or data center operating constraints, and dynamically generate additional feature variables by incorporating template inputs in a suitable combination of one or more parameters with an appropriate weightage. This data may be integrated with chiller historical operations data to produce a feature set used to generate chiller data buckets using clustering algorithms. It should be understood by those of skill in the art that in case the templates cannot be configured for one or more data centers, the system, the data buckets may be based on solely chiller historical operations data. The user can validate the resultant chiller data buckets, and in an iterative manner, accept if these are found "usable" for generating analytical models for energy efficiency optimization. Any new chillers (or data centers) can be classified into one of these data buckets based on their similarity.

In aspects of the present invention, many advantages are provided compared to traditional ways of developing energy efficiency optimization models. By way of example, the system, method and/or computer program product provide the following advantages, amongst others:

(i) Cost reduction: The invention reduces the number of AI models by a factor four (4) without compromising accuracy, thereby leading to a significant decrease in development, deployment, maintenance, infrastructure and delivery costs;

(ii) Explainable AI: The invention enables explicit user control on the machine learning modeling process and inclusion of user priorities, resulting in improved interpretability and usability of the AI models;

(iii) Data Privacy & Governance: The invention captures all data related constraints through configurable templates to generate AI models that are compliant with the data privacy and governance guidelines;

(iv) Reduction in technology personnel: Using the user-driven intuitive process with customizable and configurable no-code framework, the invention produces expected model outcomes without involvement of data science experts to optimize data center operations;

(v) Less product customizations: The invention demonstrates a framework that captures custom requirements specific to businesses through template inputs, resulting in fewer product release cycles, saving release management efforts; and It should be understood that, to the extent implementations of the invention collect, store, or employ personal information provided by, or obtained from, individuals, such information shall be used in accordance with all applicable laws concerning protection of personal information. Additionally, the collection, storage, and use of such information may be subject to consent of the individual to such activity, for example, through "opt-in" or "opt-out" processes as may be appropriate for the situation and type of information. Storage and use of personal information may be in an appropriately secure manner reflective of the type of information, for example, through various encryption and anonymization techniques for particularly sensitive information.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium or media, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or data center).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 1:
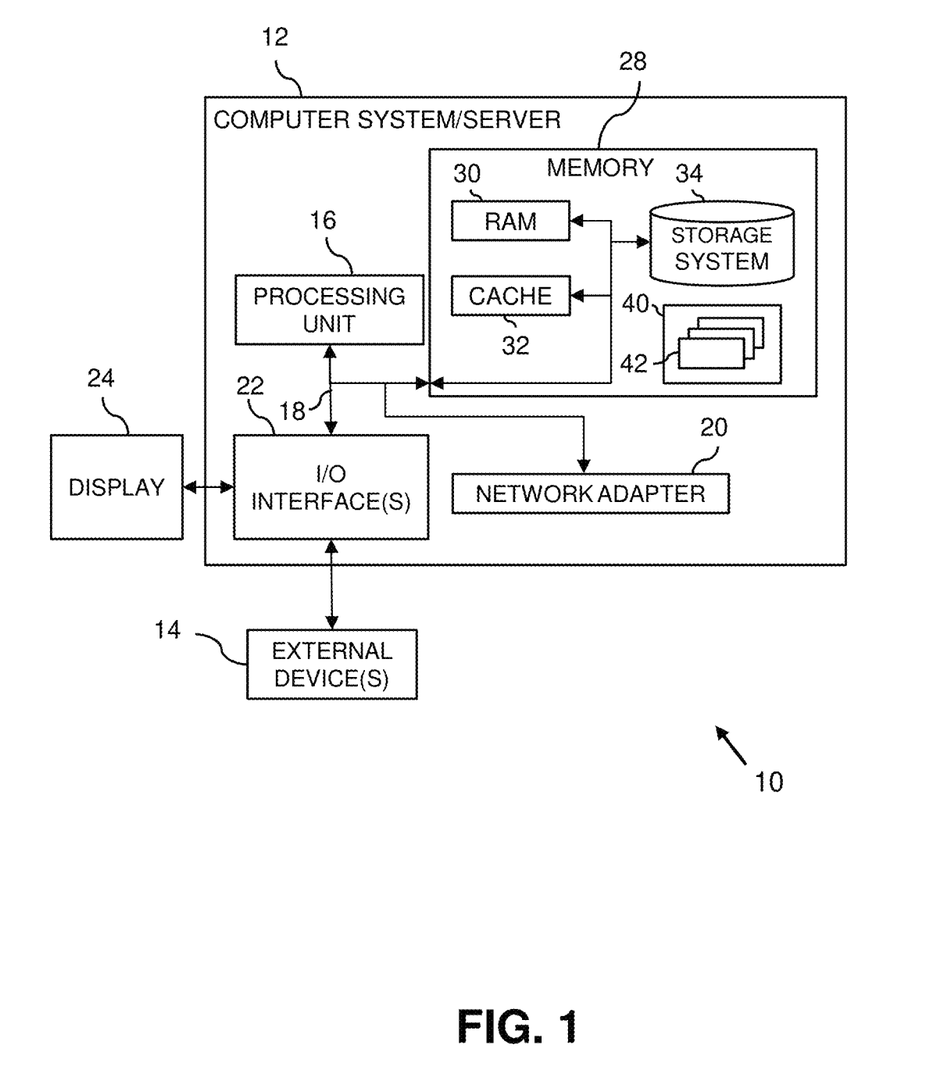
FIG. 1 depicts a cloud computing node according to an embodiment of the present invention.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
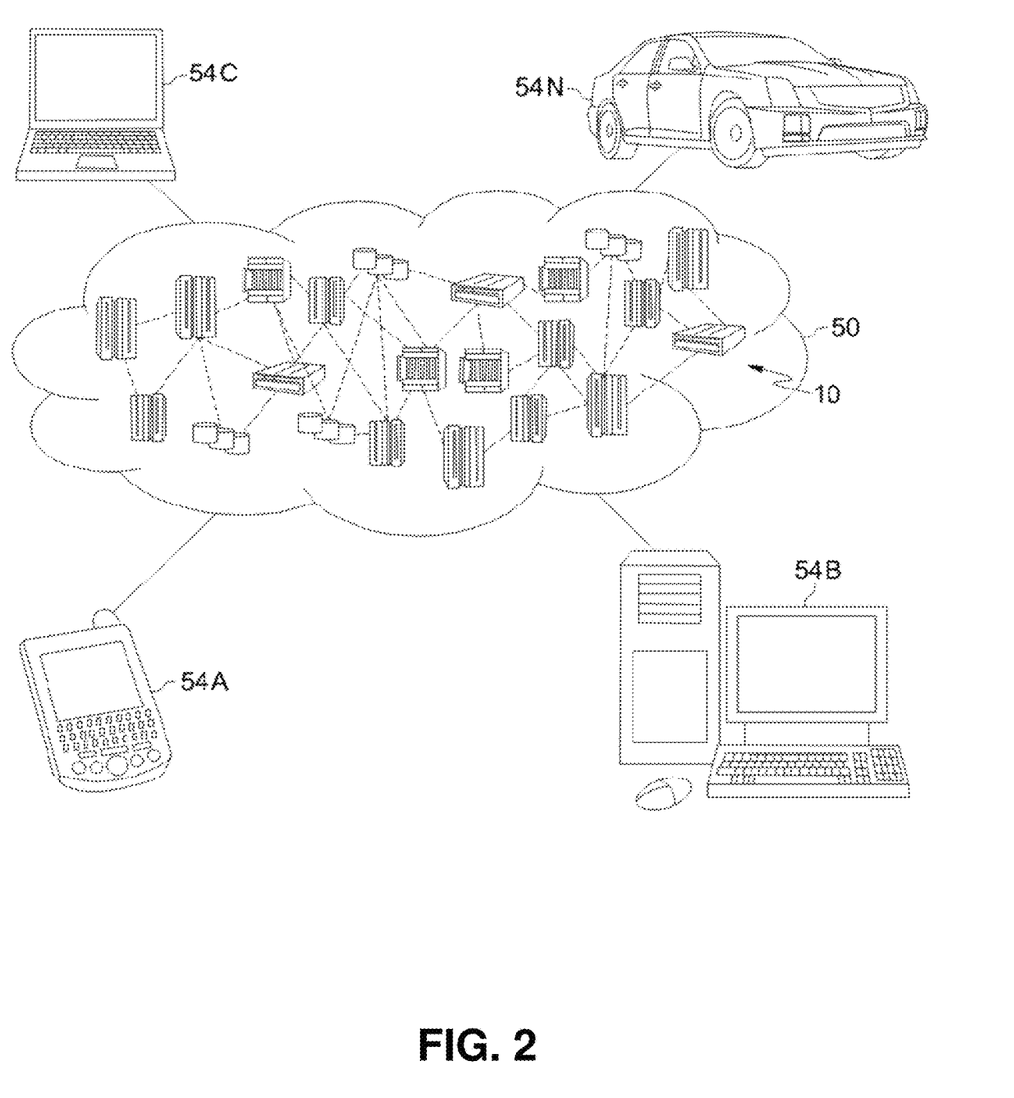
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
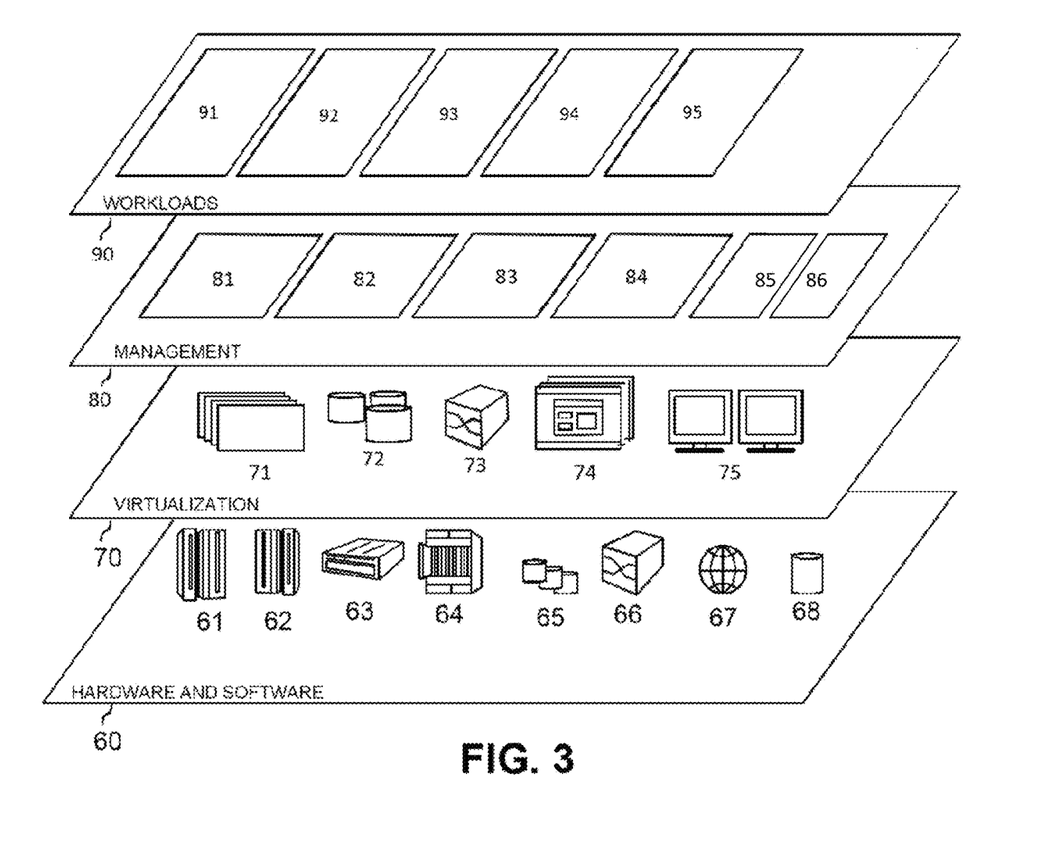
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA. Chiller energy efficiency optimization 86 may also be provided in the management layer 80 as described below.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; and transaction processing 95.

In embodiments, the chiller energy efficiency optimization 86 may generate or create the data buckets based from the configurable templates, and use these data buckets in machine learning techniques to optimize chiller energy efficiency. The data buckets may be used to add new chillers to the multiple data center set-ups as described herein.

Implementations of the invention may include a computer system/server 12 of FIG. 1 in which one or more of the program modules 42 are configured to perform (or cause the computer system/server 12 to perform) one of more functions of the chiller energy efficiency optimization 86 of FIG. 3. For example, the one or more of the program modules 42 may be configured to:

(i) integrate domain, user preferences (e.g., any combination of chiller metadata and data center consideration) and underlying data distributions, enabling generalization of chiller energy efficiency models for disparate data centers;

(ii) provide a framework with configurable templates which include the chiller metadata (e.g., type of speed drive, capacity, type of chiller, health score, and-so-forth) and data center design considerations (e.g., chiller sequencing, coupled/decoupled systems, chiller connectivity, cooling demand, geographical location, etc.);

(iii) obtain user prioritized ranked list of chiller attributes and preferences, and data center operating constraints using the configurable templates;

(iv) dynamically generate additional feature variables by incorporating the configurable template inputs in a suitable combination of one or more parameters with an appropriate weightage or score;

(v) integrate the additional features with chiller historical operations data to produce a feature set that is used to generate chiller data buckets using clustering algorithms;

(vi) validate the resultant chiller data buckets, and in an iterative manner, accept if these are found "usable" for further generating analytical models for energy efficiency optimization; and (vii) easily classify any new additional chillers (or data centers) into one of these data buckets based on their similarities.

Figure 4:
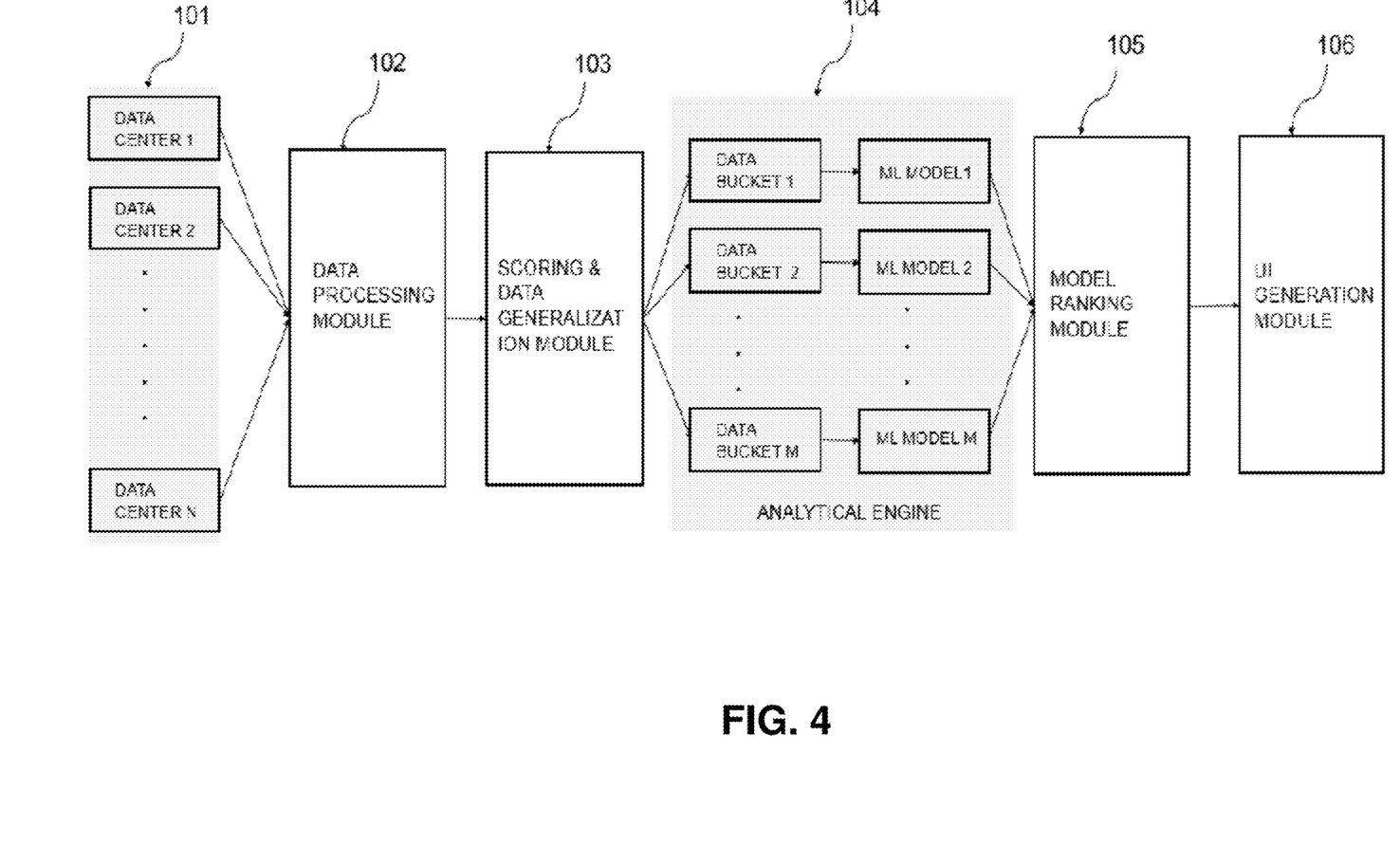
FIG. 4 shows a block diagram of an exemplary environment in accordance with aspects of the invention.

FIG. 4 shows a block diagram of an exemplary environment in accordance with aspects of the invention. In embodiments, the block diagram is a high-level architecture for generating optimized sets of analytical models to optimize chiller energy efficiency in multiple data center set-ups. The block diagram includes a plurality of disparate data centers 101, a data processing module 102, a scoring and data generalization module 103, an analytic engine 104, a model ranking module 105 and a user interface (UI) generation module 106. In embodiments, the plurality of data centers 101 each include one or more chillers required to cool servers and/or other computing equipment within the data centers.

In embodiments, the modules 102-106 may each comprise one or more program modules such as program modules 42 described with respect to FIG. 1. The different modules 102-106 may include additional or fewer modules than those shown in FIG. 4. In embodiments, separate modules 102-106 may be integrated into a single module. Additionally, or alternatively, a single module may be implemented as multiple modules. Moreover, the quantity of devices and/or networks in the environment is not limited to what is shown in FIG. 4. In practice, the environment may include additional devices and/or networks; fewer devices and/or networks; different devices and/or networks; or differently arranged devices and/or networks than illustrated in FIG. 4.

In embodiments, the data processing module 102 may obtain historical operation data from each of the chillers in each of the different data centers 1 . . . n. In embodiments, the historical operation data may include, e.g., chiller inlet/outlet temperatures, pressure, water flow rate and weather variables such as e.g., ambient temperature, relative humidity, entropy, etc., amongst other operating data. In further embodiments, the data processing module 102 may use the operations data to produce a feature set that is used to generate chiller data buckets using clustering algorithms.

The scoring and data generalization module 103 may obtain the historical operations data and can generate a chiller attribute score. The chiller attribute score in combination with the chiller historical operations data can be used to dynamically identify feature variables using suitable transformation functions. In embodiments, the chiller attribute score is computed from the configurable list of attributes as obtained from the configurable templates. And by using the configurable templates, explicit user control is provided in the modeling process by allowing a framework for the user to define or capture chiller metadata (e.g., variables and/or attributes and/or parameters of chillers) and data center design considerations used to cluster the chillers in one or more data centers into data buckets with similarities, and providing a weightage or rank to any of these attributes or other user preferences.

By way of example, below is an example equation to generate the chiller attribute score using the user ranked list of chiller properties which include, in this illustrative example, variable speed drive, capacity, health score, run time, location with the corresponding normalized weights:

$$\{F(w_0*is\_vsd, w_1*capacity, w_2*health\_score, w_3*run\_time, w_4*location)\}*K$$

The weightage constant hyperparameter as designated by reference "K" may be a configurable set of attributes (from the template framework) that are input by the user. These inputs may be, e.g., speed drives, capacity of the equipment, type of equipment, health status of equipment, any preferences, etc. The "K" value may be used to regulate the influence of the user inputs (or domain) on the chiller energy efficiency modeling process. For example, if the value of K is 0, the chiller data bucket classification will completely ignore the user inputs (obtained from the template framework), whereas, if the value of K is very high value (e.g., 1000), the classification would be purely driven by the user input. So, for example, if the value is very high, the clustering may be dominated by such user input.

It should be recognized that other chiller attributes may be used in the above example, depending on the particular importance of the attributes to the user. For example, the method, system and/or computer program product may take into consideration operator preferences of a data center (e.g., chillers with a specific kind of drives, air or water cooled, etc.), the location of the data center, similar weather conditions or chillers producing a certain degree of cooling or chillers operating in certain load, chillers seasonal operating flow rates or other metadata, or any weighted combination of one or more of these attributes. Any of these attributes may be provided within the configurable template.

The chiller data generalization then combines the chiller attribute scores with the chiller historical data to dynamically generate feature variables using suitable transformation functions. For example, below is an equation of a product function with normalized weights, where $v_1 \ldots v_5$ denote chiller historical data, $a_1 \ldots a_3$ denote weather data, and $ch_1 \ldots ch_3$ denote chiller attribute scores for the user inputs:

$$\{F(w_0*f_{Input(v1,v2,v3,v4,v5)}, w_1*f_{Input(a1,a2,a3)}, w_2*f_{Input(ch1,ch2,ch3)})\}.$$

The resultant set of feature variables (e.g., $w_0*f_{Input(v1,v2,v3,v4,v5)}, w_1*f_{Input(a1,a2,a3)}, w_2*f_{Input(ch1,ch2,ch3)}$) may be used to generate an optimal number of chiller data buckets using analytic engine 104. For example, analytic engine 104 may use machine learning clustering algorithms to generate an optimal number of chiller data buckets. It should be recognized by one of ordinary skill in the art that other feature variables are contemplated in aspects of the invention.

In embodiments, the chiller data buckets each comprise grouped chillers that are more similar (in some sense) to each other than to those in other data buckets (clusters). For example, chillers in the same data buckets may have similar properties, even though they are in different data centers. These properties can be, for example, chiller output, airflow, fluid dynamics, chillers with a specific kind of drives, air or water cooled), the location of the data center, similar weather conditions or chillers producing a certain degree of cooling or chillers operating in certain load, chillers seasonal operating flow rates or any weighted combination of one or more of these parameters. The data buckets may be optimized by using machine learning models in the analytical engine 104.

In embodiments, the machine learning algorithms may include, e.g., K-Means (for clustering), with a hybrid neural network architecture using one-dimensional convolutional neural network-long short-term memory (1D CNN-LSTM) models (for optimization), which results in coherent data buckets with the best optimization model accuracies. The appropriate clustering algorithm and parameter settings (including parameters such as the distance function to use or number of expected clusters, etc.) may depend on the individual data set and intended use of the results. Accordingly, different clustering techniques are contemplated in aspects of the invention. For example, aspects of the present invention contemplate using, amongst others, connectivity models, centroid models (k-means algorithm), distribution models, subspace models, group models, neural models, etc.

Also, as should be understood by those of skill in the art, cluster analysis or clustering is the task of grouping a set of objects in such a way that objects in the same group (called a cluster) are more similar (in some sense) to each other than to those in other groups (clusters). Clusters include groups with small distances between cluster members, intervals or particular statistical distributions, etc. Cluster analysis, as contemplated herein, may also be an iterative process or interactive multi-objective optimization that involves trial and failure. For example, it may be desirable to modify data preprocessing and model parameters until the result achieves the desired properties, which may be performed by the machine learning models until optimized models of the data buckets are achieved.

The model ranking module 105 may be used to assess, e.g., rank or score, the resultant data buckets. For example, the user can assess the quality of the resultant data buckets and can approve or reject the machine learning model outputs, based on a "coherence score." It should be understood by those of skill in the art that coherence is a property of self-consistency across a set of assessments, or the strength of association between items. Coherence score is high for each data bucket with similar values for the attributes defined in the templates are grouped into the same bucket. This score can be calculated from the normalized addition of chiller attribute scores for each chiller classified in a data bucket, e.g., $\{(1-(maxscore(c)-minscore(c))\}_1^d$, where maxscore(c) and minscore(c) are attribute scores for each chiller within that data bucket (d). The result of the above equation may be values ranging from 0 to 1, with a value between 0.7-1 considered a "coherent" data bucket (e.g., within acceptable limits). It should be understood other values may also be considered "coherent" or within acceptable limits depending on what is defined or tolerated as such by the user.

In embodiments, a maxscore is the maximum chiller attribute score for a data bucket and minscore is the minimum chiller attribute score for a data bucket. Accordingly, a higher chiller attribute score will be indicative of a useable data bucket, whereas a lower chiller attribute score may be indicative of a data bucket that does not have a particularly optimized clustering of chillers. The user can use these chiller attribute scores to reconfigure the template, e.g., add or delete certain user defined chiller attributes, to refine the data buckets with the lower chiller coherence scores.

The user interface (UI) generation module 106 can output reports of the clustering (e.g., data buckets), as well as any additional information required by the user including data center information. This additional data may be, e.g., location of data center, weather conditions at the data center, number of chillers at each location, type of computing equipment, etc., in addition to individual chiller information, e.g., attributes and parameters of the chillers such as type of chiller (air or water), output of chiller (e.g., BTU, etc.), location of chiller, etc. The user interface (UI) generation module 106 may also be used to configure the templates by the user, e.g., to add or delete different desired attributes which should be taken into consideration when generating the data buckets.

Figure 5:
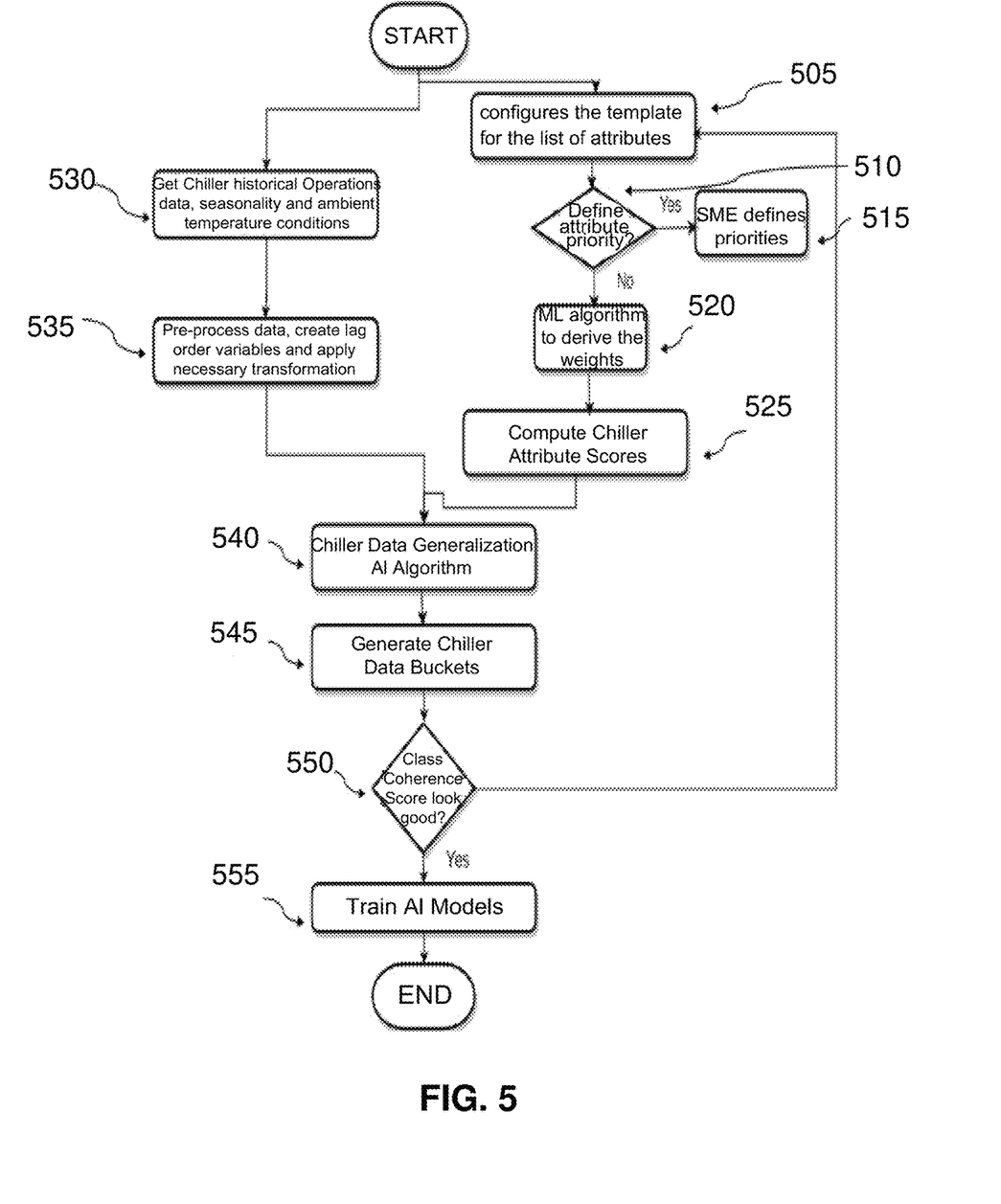
FIG. 5 shows a flowchart of an exemplary method in accordance with aspects of the invention.

FIG. 5 shows a flowchart of an exemplary method in accordance with aspects of the present invention. Steps of the method may be carried out in the environment of FIG. 4 and are described with reference to elements depicted in FIG. 4. For example, FIG. 5 is representative of a method, system and/or computer program product which produces data buckets and, using these data buckets is capable of optimizing chiller usage throughout multiple data centers.

At step 505, the system configures the template for the list of attributes. The list of attributes may be data center preferences (e.g., chillers with a specific kind of drives, air or water cooled), the location of the data center, similar weather conditions or chillers producing a certain degree of cooling or chillers operating in certain load, chillers seasonal operating flow rates, combination of one or more of these different attributes, or other chiller metadata, etc. At step 510, the system determines whether attributes will be assigned a priority, e.g., weight. If yes, at step 515, a priority is assigned to one or more of the attributes in the configurable template. If not, at step 520, a machine learning algorithm may be used to derive weights for any of the attributes. These weights may be based on chiller historical data, known operator preferences, etc.

At step 525, a chiller attribute score may be computed as described above. For example, this chiller attribute scores are used to compute a chiller coherence score that is given to each chiller data bucket. This score helps to understand the composition of chillers that are grouped in the "same" bucket.

At step 530, the system may obtain chiller historical operations data. The system may also obtain, amongst other data, seasonality and ambient temperature conditions for each location of a chiller.

At step 535, the system may pre-process the data to create lag order variables and apply any necessary transformation. In embodiments, the lag order variables may be historical operations data for any predetermined amount of time, e.g., normalized data for a previous 5-day period.

At step 540, the chiller historical operations data and the chiller attribute score may be used to provide (e.g., create or calculate) chiller data generalization data using, e.g., an artificial intelligence engine. For example, the chiller data generalization combines the chiller attributes with the chiller historical data (e.g., chiller inlet/outlet temperatures, pressure, water flow rate) and weather variables (e.g., ambient temperature, relative humidity, entropy) to dynamically generate feature variables using suitable transformation functions. In embodiments, the chiller attribute score may be calculated from the chiller design attributes (e.g., its health state, operating conditions, etc.) defined in the template (as per their ranking or weightage). This score is used to calculate the coherence score of each chiller data bucket.

At step 545, the system may use the chiller data generalization to generate or create chiller data buckets. In embodiments, the chiller data generalization generates appropriate additional feature variables driven by all the template inputs. In embodiments, additional feature variables may be generated depending on the template inputs and are dynamically determined during run-time. For example, in an embodiment, if a user ranks the chiller capacity or type as a priority, along with one or more of the operating constraints or preferences for a specific chiller, the system takes these inputs to generate a normalized weighted average of the combination of these attributes as per their ranking and includes these into the final feature set. Additionally, it uses a hyper-parameter or weightage constant "K" (as noted above) to control the impact of the template inputs on the generation of chiller data buckets.

In embodiments, the chiller data buckets will organize groups of chillers with similar attributes into a same data bucket. These similarities may include any of the attributes noted herein including, but not limited to, types of chillers, operating conditions of chillers, chiller output, airflow, fluid dynamics, chillers with a specific kind of drives, air or water cooled, similar weather conditions or chillers producing a certain degree of cooling or chillers operating in certain load, chillers seasonal operating flow rates or any weighted combination of one or more of these parameters, etc.

At step 550, the system determines whether the class coherence of the data buckets is within desired limits. For example, as noted above, a value between 0.7-1 may be considered within desired limits. After the coherence score of the data buckets is found acceptable, the system may rank the bucket in terms of their optimization potential (e.g., ordered by this score). The user could then select which data bucket (and essentially which set of chillers) to optimize.

Post selection, the AI model is then trained with the historical data of the corresponding set of chillers and provides recommendations to the operator on what parameters can be tweaked for a more efficient energy utilization. Examples of recommendation could be "increase evaporator outlet-temperature to X degree C.", "increase the condenser inlet-temperature to X degrees C.", "decrease evaporator water volume-flow to X m3/h", etc. In embodiments, the AI modeling process may be automatically triggered or initiated by the user. In this way, it is now possible to validate the resultant chiller data buckets, and in an iterative manner, accept if these are found "usable" for further generating analytical models for energy efficiency optimization.

For example, if the class coherence of the data buckets is within desired limits, at step 555, the data buckets may be used to generate machine leaning optimization models. In embodiments, training of the model works iteratively on the data to "fit" the best weights and biases to an algorithm to minimize the loss function over the prediction range. For example, when the class coherence score is found acceptable, an artificial model is trained with historical data of the various operational parameters like temperature, pressure, flow rate, load, refrigeration, frequency, power, etc., to create a mathematical representation between the "input" (e.g., the operational parameters) and the "target" (e.g., the energy utilization). This model is then used to provide recommendations on the various control parameters (e.g., temperature set points, pressure set points) that can be modified for an efficient energy utilization.

In embodiments, a chiller energy efficiency machine learning model may be a cognitive model that is predictive and prescriptive. For example, the chiller energy efficiency machine learning model may provide recommendations on which chillers, what type, under which constraints, on what environmental conditions, etc., it operates to minimize the power consumption and thereby to maximise the chiller energy efficiency, contributing to an overall energy efficiency optimization.

If the system determines that the class coherence of the buckets is not within desired limits, the system may revert back to step 505 in order to further configure the data. For example, for data buckets that do not meet the acceptable limit of the "coherence score", the system notifies the user and suggests corrective actions. This corrective action may include adjusting the configurable parameters in the template framework to re-group these set of chillers differently, validate if the chillers associated with this bucket are running under appropriate operating conditions, or alter the value of the hyperparameter "K", as non-limiting examples.

It should be recognized that by using this data, for any additional chillers, a "chiller data mismatch score" may be computed. In this way, using the configurable template, new chillers can be classified into one of the existing data buckets based on the minimum distance from a chiller data bucket centroid. That is, new chillers (or data centers) can now be easily classified into one of these data buckets based on their similarities without the need to develop new energy efficiency optimization models.

Figure 6:
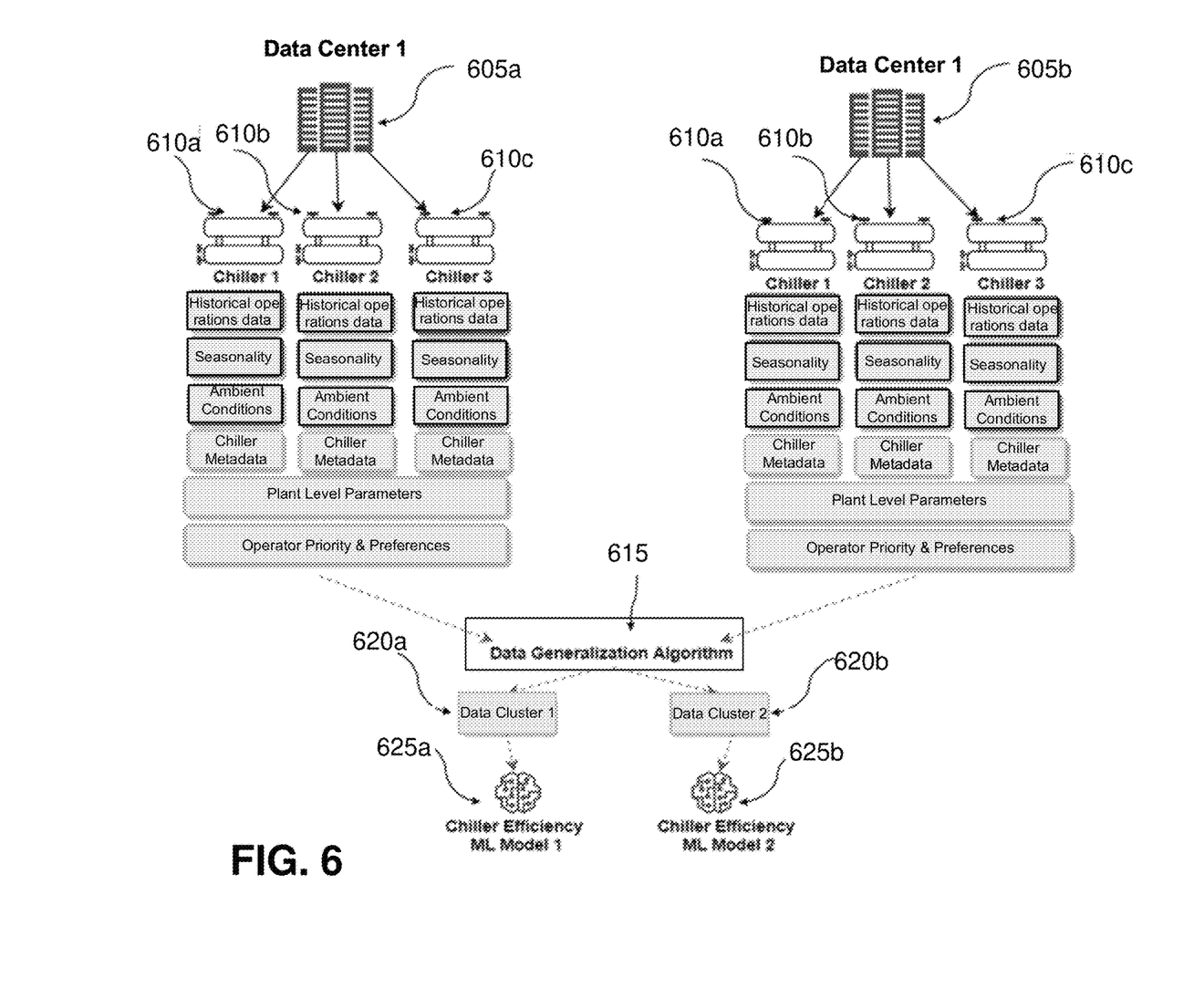
FIG. 6 shows an exemplary method/block diagram in accordance with aspects of the invention.

FIG. 6 shows an exemplary method/block diagram in accordance with aspects of the invention. More specifically, FIG. 6 represents a framework where a generalized chiller energy efficiency model has been built with an optimized set of analytical models, utilizing domain parameters in accordance with aspects of the invention.

In the representative model of FIG. 6, two data centers 605a, 605b are shown each having a plurality of chillers 610a, 610b, 610c. In embodiments, the chillers 610a, 610b, 610c each have associated therewith data including, e.g., historical operation data, seasonality and ambient conditions, in addition to chiller metadata. In addition, each data center 605a, 605b includes plant level parameters and operator priorities and preferences. The priorities and preferences, for example, can be weighted according to their importance, each of which can be included with the other data in a configurable template. The data is then used by the data generalization algorithm, e.g., clustering algorithm(s), to generate the data clusters (e.g., data buckets) 620a, 620b. In embodiments, the data clusters 620a, 620b may include any combination of the chillers 610a, 610b, 610c from any combination of the data center 605a, 605b based on their similarities. The data clusters can then be used to create chiller energy efficiency machine learning models 625a, 625b for energy efficiency optimization.

Accordingly, it is now possible using the obtained data to improve chiller energy efficiency across multi-data centers. For example, in embodiments, the models may prescribe which chiller operating parameters need to be altered to minimize the power consumption, thereby optimizing chiller efficiencies. In addition, the model may prescribe which type or capacity of chillers need to be operated under specific constraints and/or environmental conditions to minimize power consumption and optimizing chiller efficiencies.

Figure 7:
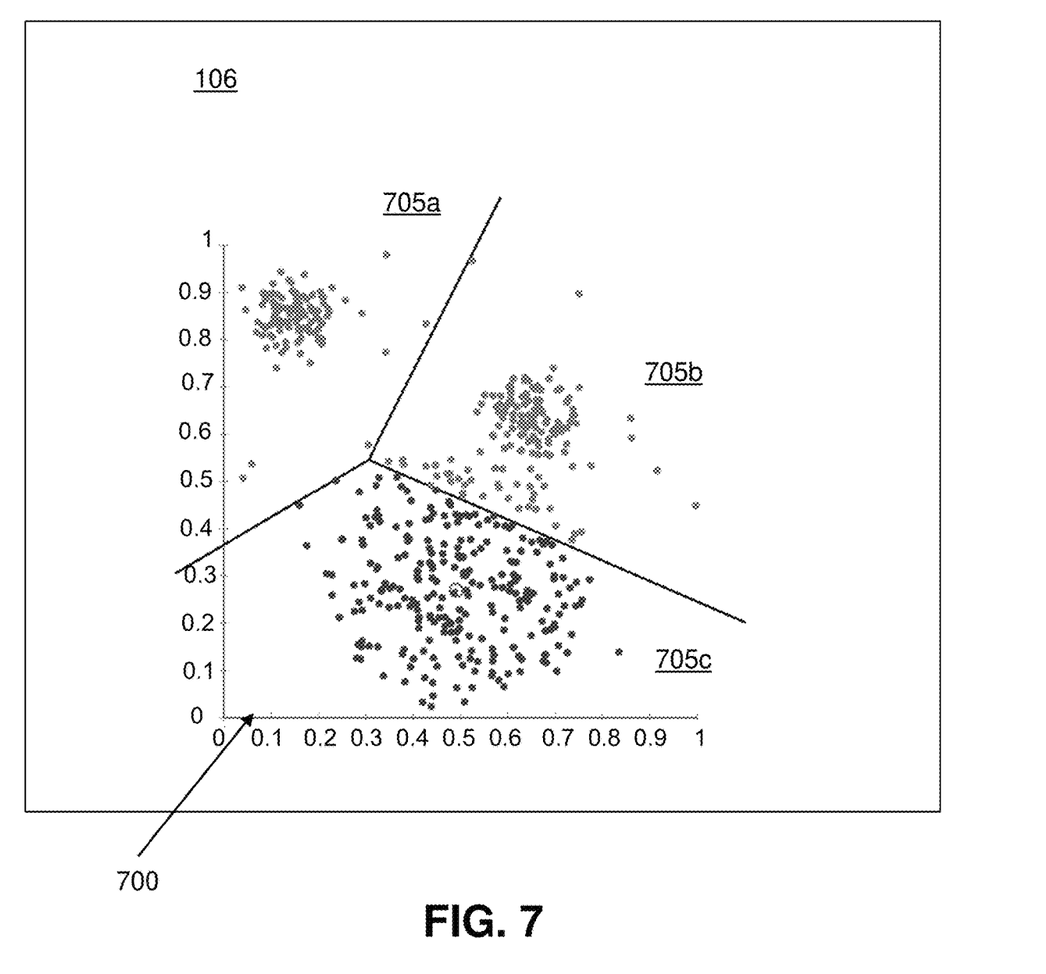
FIG. 7 shows a cluster graph for different chillers in accordance with aspects of the present disclosure.

FIG. 7 shows a cluster graph for different chillers in a multiple data center set-up in accordance with aspects of the present disclosure. In particular, the cluster graph 700, which can be displayed on the graphical user interface 106, shows three data buckets 705a, 705b, 705c. These data buckets 705a, 705b, 705c each include groups of chillers (as represented by points on the graph 700) with similar attributes. In this representation, the user may validate any of the data buckets 705a, 705b, 705c, refine the clustering by reconfiguring the templates or removing outlying chillers, etc. In addition, new or additional chillers (or data centers) can be easily classified into one of these data buckets 705a, 705b, 705c based on its similarity to the existing attributes of the chillers within the data buckets 705a, 705b, 705c, without the need to generate new models for each chiller.

In embodiments, a service provider could offer to perform the processes described herein. In this case, the service provider can create, maintain, deploy, support, etc., the computer infrastructure that performs the process steps of the invention for one or more customers. These customers may be, for example, a business that uses data center modeling or set-up. In return, the service provider can receive payment from the customer(s) under a subscription and/or fee agreement and/or the service provider can receive payment from the sale of advertising content to one or more third parties.

In still additional embodiments, the invention provides a computer-implemented method, via a network. In this case, a computer infrastructure, such as computer system/server 12 (FIG. 1), can be provided and one or more systems for performing the processes of the invention can be obtained (e.g., created, purchased, used, modified, etc.) and deployed to the computer infrastructure. To this extent, the deployment of a system can comprise one or more of: (1) installing program code on a computing device, such as computer system/server 12 (as shown in FIG. 1), from a computer-readable medium; (2) adding one or more computing devices to the computer infrastructure; and (3) incorporating and/or modifying one or more existing systems of the computer infrastructure to enable the computer infrastructure to perform the processes of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   integrating, by a computing device, a combination of user identified parameters in a template-based framework with historical operations data of a plurality of data centers in a multiple data center set-up to produce a feature set of parameters;
   clustering, by the computing device, the feature set of parameters into an optimal number of groups, each of which comprise similar physical attributes of data center infrastructure components associated with any of the plurality of data centers;
   generating, by the computing device, analytical models for data center infrastructure component energy efficiency optimization of the multiple data center set-up based on the optimal number of groups; and
   providing recommendations from the analytical models as to which parameters are to be adjusted to have a more efficient energy utilization of the data center infrastructure components.

2. The method of claim 1, wherein the data center infrastructure component comprises one of a chiller, a water pump, a computer room air handler, and a cooling tower.

3. The method of claim 1, further comprising dynamically generating feature variables by incorporating the user identified parameters and data center design parameters from the template-based framework.

4. The method of claim 3, further comprising identifying a precise combination of parameters of the user identified parameters with a corresponding relevant weightage.

5. The method of claim 4, wherein the precise combination of parameters with its corresponding relevant weightage are integrated with the historical operations data to generate the feature set of parameters to cluster into the optimal number of groups.

6. The method of claim 1, further comprising:
   determining that a class coherence score of the clustered optimal number of groups is not within an acceptable limit;
   notifying the user that the class coherence score is not within the acceptable limit; and
   suggesting corrective actions to be taken such that the class coherence score will be placed within the acceptable limit.

7. The method of claim 1, further comprising determining that a class coherence score of the clustered optimal number of groups is within an acceptable limit and training a machine learning based clustering algorithm to minimize loss function over a prediction range.

8. The method of claim 1, further comprising ranking each group of the optimal number of groups and generating a data center infrastructure component attribute score using a weighted function of the user identified parameters.

9. The method of claim 8, wherein the weighted function using an additional hyper-parameter regulates influence of the user inputs on the data center infrastructure component energy efficiency modeling process.

10. The method of claim 9, further comprising combining the data center infrastructure component attribute score with the historical operations data to dynamically generate feature variables using transformation functions that are then used to generate the optimal number of groups.

11. The method of claim 1, wherein the user identified parameters are provided within a configurable template.

12. The method of claim 1, further comprising classifying a new data center infrastructure component into one of the optimal number of groups that has similar physical attributes to the new data center infrastructure component.

13. A computer program product comprising one or more computer readable storage media having program instructions collectively stored on the one or more computer readable storage media, the program instructions executable to:
   obtain data center infrastructure components historical operations data of data centers in a multiple data center set-up;
   compute a data center infrastructure component attribute score obtained of from a list of attributes in a template framework and which is associated with data centers in a multiple data center set-up; and create data center infrastructure component data buckets using a clustering algorithm, wherein the data center infrastructure component data buckets are an optimal number of groupings of data center infrastructure components each of which include similar attributes as defined in templates of the template framework.

14. The computer program product of claim 13, further comprising assigning priorities to attributes in the list of attributes, which control impact of template inputs and the data center infrastructure component data buckets.

15. The computer program product of claim 13, further comprising determining a class coherence score of each of the data center infrastructure component data buckets.

16. The computer program product of claim 15, wherein the class coherence score signifies whether the data center infrastructure component data buckets are valid data center infrastructure component data buckets.

17. The computer program product of claim 13, further comprising using seasonality and ambient temperature conditions for each data center to compute the data center infrastructure component data generalization data.

18. The computer program product of claim 13, further comprising classifying a new data center infrastructure component into an existing one of the data center infrastructure component data buckets based on a minimum distance from a data center infrastructure component data bucket centroid.

19. The computer program product of claim 13, further comprising weighting one or more attributes in the list of configurable attributes.

20. A system comprising:

a processor, a computer readable memory, one or more computer readable storage media, and program instructions collectively stored on the one or more computer readable storage media, the program instructions executable to:

integrate a combination of user identified parameters within a template-based framework with historical operations data of a plurality of data centers in a multiple data center set-up to produce a feature set of parameters;

cluster the feature set of parameters into an optimal number of groups, each of which comprise similar physical attributes of data center infrastructure components associated with any of the plurality of data centers; and generate analytical models for data center infrastructure component energy efficiency optimization of the multiple data center set-up based on the optimal number of groups.

* * * * *